US010354869B2

(12) United States Patent
Kim et al.

(10) Patent No.: US 10,354,869 B2
(45) Date of Patent: Jul. 16, 2019

(54) NANOWIRE BUNDLE AND METHOD OF MANUFACTURING NANOSTRUCTURE

(71) Applicants: Samsung Display Co., Ltd., Yongin-si (KR); POSTECH Academy-Industry Foundation, Pohang-si (KR)

(72) Inventors: Dae Hyun Kim, Hwaseong-si (KR); Jong Hyuk Kang, Suwon-si (KR); Hyun Deok Im, Seoul (KR); Hyun Min Cho, Seoul (KR); Yongju Kwon, Bonghwa-gun (KR); Bomi Kim, Osan-si (KR); Sung-Jee Kim, Pohang-si (KR); Mihye Lim, Gumi-si (KR)

(73) Assignees: Samsung Display Co., Ltd., Yongin-si (KR); POSTECH Academy-Industry Foundation, Pohang-si (KR)

( * ) Notice: Subject to any disclaimer, the term of this patent is extended or adjusted under 35 U.S.C. 154(b) by 0 days.

(21) Appl. No.: 15/730,376

(22) Filed: Oct. 11, 2017

(65) Prior Publication Data

US 2018/0102249 A1    Apr. 12, 2018

(30) Foreign Application Priority Data

Oct. 12, 2016 (KR) ........................ 10-2016-0132288

(51) Int. Cl.
*H01L 21/02* (2006.01)
*B82Y 40/00* (2011.01)
*B82Y 30/00* (2011.01)

(52) U.S. Cl.
CPC ........ *H01L 21/02601* (2013.01); *B82Y 40/00* (2013.01); *H01L 21/02392* (2013.01);
(Continued)

(58) Field of Classification Search
CPC ......... H01L 21/02601; H01L 21/02543; H01L 21/02628; H01L 21/02603;
(Continued)

(56) References Cited

U.S. PATENT DOCUMENTS 6,788,453 B2   9/2004   Banin et al.
8,471,969 B2   6/2013   Banin et al.
(Continued)

FOREIGN PATENT DOCUMENTS

KR         10-0871961      12/2008
KR      10-2009-0083600     8/2009
(Continued)

OTHER PUBLICATIONS

Liberato Manna et al., "Synthesis of Soluble and Processable Rod-, Arrow-, Teardrop-, and Tetrapod-Shaped CdSe Nanocrystals," Journal of American Chemical Society, Dec. 1, 2000, pp. 12700-12706, vol. 122, No. 51, American Chemical Society.

(Continued)

*Primary Examiner* — Kyoung Lee
(74) *Attorney, Agent, or Firm* — H.C. Park & Associates, PLC

(57) ABSTRACT

A method of manufacturing a nanostructure includes: heating a mixed solution to a first temperature, the mixed solution including a solvent, a compound including indium, and an octadecylphosphonic acid; heating the mixed solution to a second temperature; injecting, after heating the mixed solution to the second temperature, a phosphine precursor into the mixed solution; and heating the mixed solution including the injected phosphine precursor to a third temperature.

20 Claims, 12 Drawing Sheets

(52) U.S. Cl.
CPC .. *H01L 21/02543* (2013.01); *H01L 21/02603* (2013.01); *H01L 21/02628* (2013.01); *H01L 21/02636* (2013.01); *H01L 21/02667* (2013.01); *B82Y 30/00* (2013.01)

(58) Field of Classification Search
CPC ......... H01L 21/02392; H01L 21/02636; H01L 21/02667; B82Y 30/00
See application file for complete search history.

(56) References Cited

U.S. PATENT DOCUMENTS

| | | | |
|---|---|---|---|
| 8,778,478 | B2 | 7/2014 | Shenhar et al. |
| 9,224,920 | B2 | 12/2015 | Jeong et al. |
| 2006/0211183 | A1* | 9/2006 | Duan .................... B82Y 10/00 438/149 |
| 2008/0258159 | A1 | 10/2008 | Jun et al. |
| 2010/0301276 | A1 | 12/2010 | Lee et al. |

FOREIGN PATENT DOCUMENTS

| | | |
|---|---|---|
| KR | 10-1103841 | 1/2012 |
| KR | 10-1305554 | 9/2013 |

OTHER PUBLICATIONS

Guohua Jia et al., "Emerging strategies for the synthesis of monodisperse colloidal semiconductor quantum rods," Journal of Material Chemistry C, Jul. 1, 2015, pp. 8284-8293, vol. 3, No. 32, The Royal Society of Chemistry.

Sandeep Kumar et al., "Shape Control of II-VI Semiconductor Nanomaterials," Small, Jan. 13, 2006, pp. 316-329, vol. 2, No. 3, Wiley-VCH Verlag GmbH & Co. KGaA.

Thomas Martensson et al., "Epitaxial III-V Nanowires on Silicon," Nano Letters, Sep. 23, 2004, pp. 1987-1990, vol. 4, No. 10, American Chemical Society.

Steven T. Boles et al., "Influence of indium and phosphine on Au-catalyzed InP nanowire growth on Si substrates," Journal of Crystal Growth, Feb. 15, 2009, pp. 1446-1450, vol. 311, No. 5, Elsevier B.V.

Premila Mohan et al., "Controlled growth of highly uniform, axial/radial direction-defined, individually addressable InP nanowire arrays," Nanotechnology, Oct. 20, 2005, pp. 2903-2907, vol. 16, No. 22, Institute of Physics Publishing.

Kimberly A. Dick et al., "A New Understanding of Au-Assisted Growth of III-V Semiconductor Nanowires," Advanced Functional Materials, Aug. 22, 2005, pp. 1603-1610, vol. 15, No. 10, Wiley-VCH Verlag GmbH & Co. KGaA.

Fudong Wang et al., "Spectroscopic Properties of Colloidal Indium Phosphide Quantum Wires," Journal of American Chemical Society, Oct. 30, 2007, pp. 14327-14335, vol. 129, No. 46, American Chemical Society.

Shihai Kan et al., "Synthesis and size-dependent properties of zinc-blende semiconductor quantum rods," Nature Materials, Feb. 9, 2003, pp. 155-158, vol. 2, Nature Publishing Group (including "Corrigendum: Synthesis and size-dependent properties of zinc-blende semiconductor quantum rods," Nature Materials, Jan. 2004, p. 72, vol. 3, Nature Publishing Group).

Xiaogang Peng et al., "Shape Control of CdSe nanocrystals," Nature, Mar. 2, 2000, pp. 59-61, vol. 404, Macmillan Magazines Ltd.

Xiangfeng Duan et al, "Indium phosphide nanowires as building blocks for nanoscale electronic and optoelectronic devices," Nature, Jan. 4, 2001, pp. 66-69, vol. 409, Macmillan Magazines Ltd.

Jovan M. Nedeljković et al., "Growth of InP Nanostructures via Reaction of Indium Droplets with Phosphide Ions: Syntehsis of InP Quantum Rods and InP—TiO2 Composites," Journal of American Chemical Society, Feb. 4, 2004, pp. 2632-2639, vol. 126, No. 8, American Chemical Society.

Yu Huang et al., "Directed Assembly of One-Dimensional Nanostructures into Functional Networks," Science, Jan. 26, 2001, pp. 630-633, vol. 291, No. 5504, American Association for the Advancement of Science.

S. P. Ahrenkiel et al., "Synthesis and Characterization of Colloidal InP Quantum Rods," Nano Letters, May 13, 2003, pp. 833-837, vol. 3, No. 6, American Chemical Society.

Yi-Hsin Liu et al., "Lamellar Assembly of Cadmium Selenide Nanoclusters into Quantum Belts," Journal of the American Chemical Society, Sep. 9, 2011, pp. 17005-17013, vol. 133, No. 42, American Chemical Society.

\* cited by examiner

NANOWIRE BUNDLE AND METHOD OF MANUFACTURING NANOSTRUCTURE

CROSS-REFERENCE TO RELATED APPLICATION

This application claims priority from and the benefit of Korean Patent Application No. 10-2016-0132288, filed Oct. 12, 2016, which is hereby incorporated by reference for all purposes as if fully set forth herein.

BACKGROUND

Field

Exemplary embodiments relate to a nanowire bundle and a method of manufacturing a nanostructure.

Discussion

Semiconductor nanorods may be based upon cadmium-based (e.g., CdS, CdSe, and CdTe) groups II-VI semiconductor materials. However, heavy metal materials, such as cadmium, cause environmental pollution and human toxicity so industry regulations regarding such semiconductor materials are gradually increasing.

Compositions of semiconductor nanorods based on the groups III-V to which non-heavy-metal semiconductors belong have isotropic lattices with a zinc blende structure, differing from cadmium-based semiconductor materials on the basis of the groups II-VI having anisotropic lattices in a wurtzite structure. Therefore, the composition of the groups III-V-based semiconductor nanorods to which the non-heavy-metal semiconductors belong may have a difficulty in one-dimensional structure growth with the same mechanism as the composition of cadmium-based semiconductor nanorods.

The above information disclosed in this section is only for enhancement of an understanding of the background of the inventive concepts, and, therefore, it may contain information that does not form prior art already known to a person of ordinary skill in the art.

SUMMARY

Some exemplary embodiments provide a method of manufacturing a nanostructure using a relatively simple and economical approach. The nanostructure may be an indium phosphide (InP) nanostructure.

Some exemplary embodiments provide a nanowire bundle, such as an indium phosphide nanowire bundle.

Additional aspects will be set forth in the detailed description which follows, and, in part, will be apparent from the disclosure, or may be learned by practice of the inventive concepts.

According to some exemplary embodiments, a method of manufacturing a nanostructure includes: heating a mixed solution to a first temperature, the mixed solution including a solvent, a compound including indium, and an octadecylphosphonic acid; heating the mixed solution to a second temperature; injecting, after heating the mixed solution to the second temperature, a phosphine precursor into the mixed solution; and heating the mixed solution including the injected phosphine precursor to a third temperature.

According to some exemplary embodiments, a nanowire bundle includes: a first indium phosphide nanowire; and a second indium phosphide nanowire combined with the first indium phosphide nanowire.

According to some exemplary embodiments, an indium phosphide nanostructure may be manufactured relatively easily and economically. Also, according to some exemplary embodiments, an indium phosphide nanowire bundle structure may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1A:
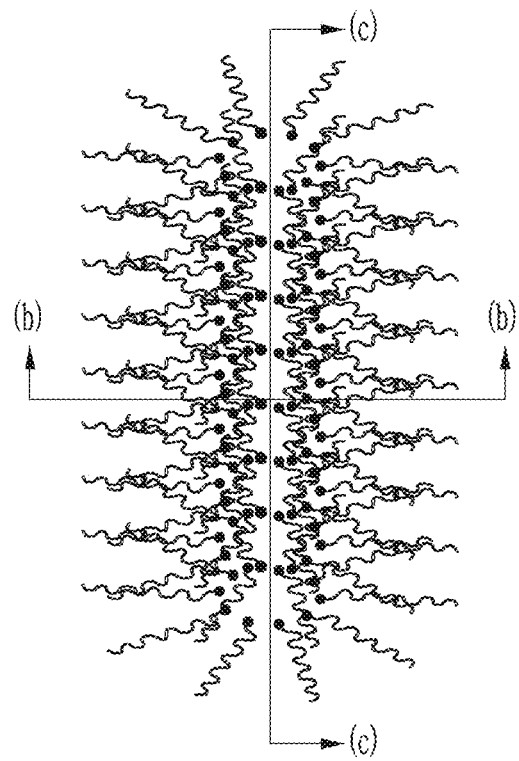
FIG. 1A is a depiction of a micelle structure according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Further, as used herein, the phrase "on a plane" means viewing an object portion from the top, and the phrase "on a cross-section" means viewing, from a side, a cross-section of an object portion that is vertically cut.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A method for manufacturing an indium phosphide nanostructure according to some exemplary embodiments will now be described with reference to the accompanying drawings. The indium phosphide nanostructure may include an indium phosphide nanorod, an indium phosphide nanowire, and an indium phosphide nanowire bundle. The nanorod may include a nanostructure with an aspect ratio of about 5 to about 30. The nanowire includes a nanostructure with an aspect ratio of about 40 to about 200. The nanowire bundle includes a structure in which at least ten nanowires are combined. The nanowire bundle may be a structure in which 10 to 100 nanowires with an aspect ratio of about 40 to about 200 are combined. The aspect ratio signifies a ratio of a short-axis to a long-axis of a nanostructure, such as a nanorod.

The method for manufacturing an indium phosphide nanostructure, according to some exemplary embodiments, may be composed of a solution process, and it may represent a method of arranging complex compounds of indium-octadecylphosphonic acid in a solution to form a template and growing an indium phosphide core using the template. The method does not use a metal nanoparticle catalyst that is introduced to existing solution processes at least because the indium phosphide core is formed to grow in the template. That is, the template, according to some exemplary embodiments, represents a case in which the indium phosphide core is formed and grows to manufacture an indium phosphide nanostructure.

A method of manufacturing a nanostructure according to some exemplary embodiments will now be described in more detail. The method of manufacturing a nanostructure may include: heating a mixed solution to a first temperature, the mixed solution including a solvent, a compound including indium, and an octadecylphosphonic acid; heating the mixed solution to a second temperature; injecting, after heating the mixed solution to the second temperature, a phosphine precursor into the mixed solution; and heating the mixed solution including the injected phosphine precursor to a third temperature.

First, the stage of heating a mixed solution including a solvent, a compound including indium, and an octadecylphosphonic acid to a first temperature will be described.

The stage of heating the mixed solution to a first temperature includes forming an indium-octadecylphosphonic acid complex compound by a reaction of a compound including indium and an octadecylphosphonic acid. The indium-octadecylphosphonic acid complex compound formed in this stage becomes a template for growing an indium phosphide core.

In the present stage, the first temperature may be about 280 degrees Celsius (° C.) to about 320° C. For instance, the first temperature may be about 300° C. Further, in the present stage, the heating may be performed while injecting $N_2$ gas.

In the present stage, the compound including indium may be at least one of an indium acetate ($In(OAc)_3$) and an indium chloride ($InCl_3$). However, the compound including indium is not limited when it is a compound including trivalent indium ($In^{3+-}$). In addition, the solvent may be used without limit when it is a hydrocarbon compound with a boiling point of about 250° C. to about 350° C. For example, the solvent may be a 1-octadecene.

The indium in the compound including indium and the octadecylphosphonic acid are combined in the solvent to generate a complex compound expressed in Formula 1.

decylphosphonic acid becomes hydrophobic. Regarding the compounds of Formula 1 existing in the solution, the hydrophilic portions of the compounds are provided near the hydrophilic portions, and the hydrophobic portions are provided near the hydrophobic portions to form a micelle structure.

Figure 1B:
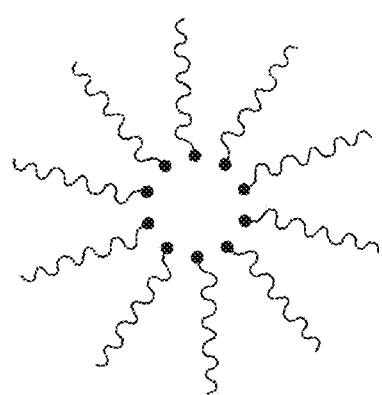
FIG. 1B is a cross-sectional view of the micelle structure of FIG. 1A taken along sectional line (b)-(b) according to some exemplary embodiments.
Figure 1C:
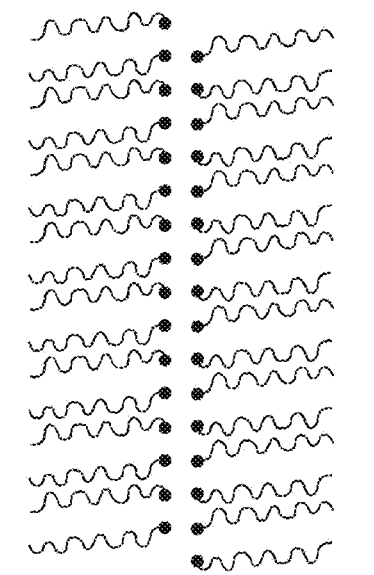
FIG. 1C is a cross-sectional view of the micelle structure of FIG. 1A taken along sectional line (c)-(c) according to some exemplary embodiments.

FIG. 1A is a depiction of a micelle structure according to some exemplary embodiments. FIG. 1B is a cross-sectional view of the micelle structure of FIG. 1A taken along sectional line (b)-(b) according to some exemplary embodiments. FIG. 1C is a cross-sectional view of the micelle structure of FIG. 1A taken along sectional line (c)-(c) according to some exemplary embodiments. It is noted that FIGS. 1A to 1C show views of a micelle structure of an indium-octadecylphosphonic acid complex compound.

Referring FIGS. 1A to 1C, a head portion on which the indium is provided gathers to an inner portion of the micelle structure, and the octadecylphosphonic acid is provided toward the outside. FIGS. 1A to 1C show that two octadecylphosphonic acids are connected to one indium ($In^{3+}$), which is for an ease of illustration, and, in actuality, three octadecylphosphonic acids may be connected to one indium.

The stage for heating the mixed solution to a second temperature and injecting a phosphine precursor will now be described.

The phosphine precursor may include tris(trimethylsilyl)phosphine ($P(SiCH_3)_3$). The present stage is for forming an indium phosphide core. That is, the indium (In) in the solution reacts with the phosphorus (P) of the phosphine precursor injected in the present stage to form an indium phosphide core. In the present stage, a mole ratio of indium (In):octadecylphosphonic acid (ODPA):phosphorus (P) in

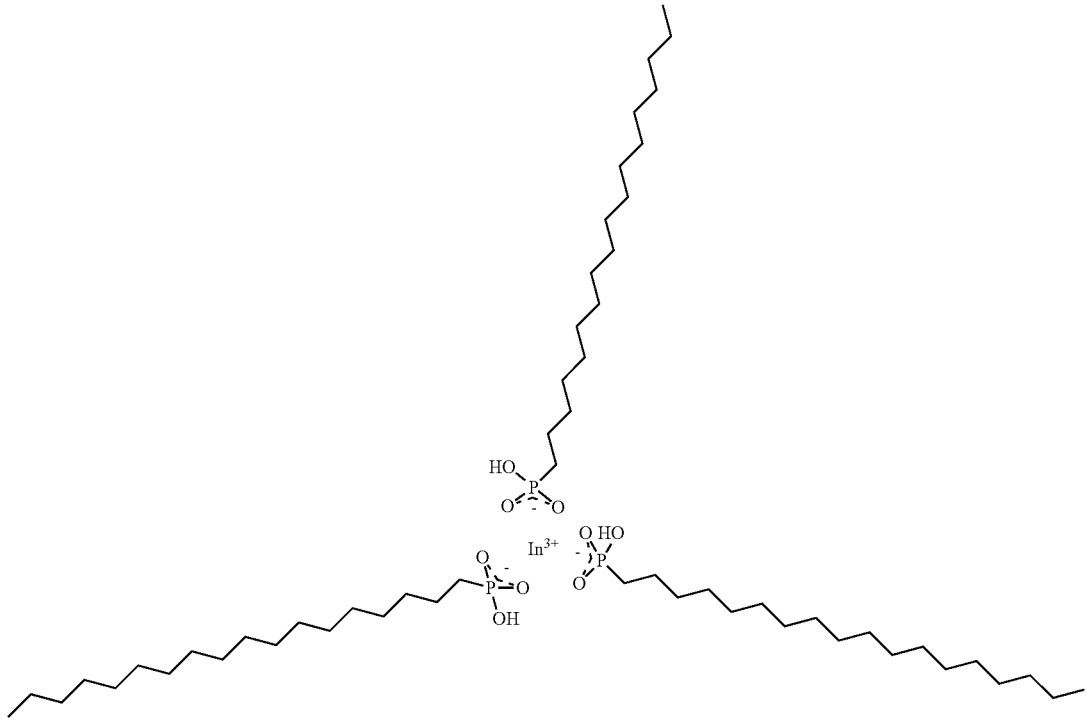

Formula 1

Here, the indium ($In^{3+}$) portion of the compound expressed in Formula 1 becomes hydrophilic, and the octathe solution is about 1:3-5:4-6. That is, the mole ratio of In:ODPA:P may be about 1:3:4 to about 1:5:6. For example, the mole ratio of In:ODPA:P in the solution may be about 1:4:5. When the mole ratio of In:ODPA:P digresses from 1:3-5:4-6, amorphous nanoparticles may be formed in addition to the nanostructures extending in one dimension, such as the nanorod, the nanowire, or the nanowire bundle.

In the present stage, a reaction formula for the indium-octadecylphosphonic acid complex compound to react with the tris(trimethylsilyl)phosphine to form an indium phosphide is expressed below by Formula 2.

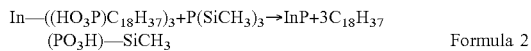

$$\text{In---}((HO_3P)C_{18}H_{37})_3 + P(SiCH_3)_3 \rightarrow InP + 3C_{18}H_{37}(PO_3H)\text{---}SiCH_3 \qquad \text{Formula 2}$$

Figure 2:
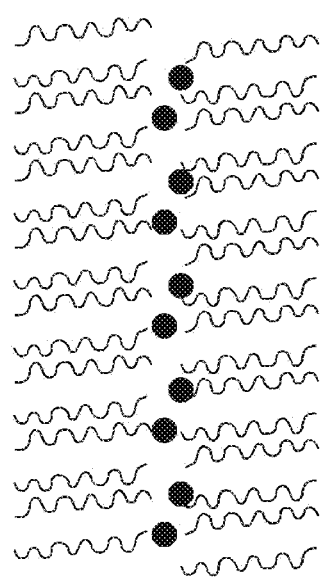
FIG. 2 shows an indium phosphide core formed in a process of manufacturing indium phosphide according to some exemplary embodiments.

Here, indium is included in the solution as an indium-octadecylphosphonic acid complex compound micelle and is provided on an inner side of the micelle so the indium phosphide core is formed inside the micelle. FIG. 2 shows an indium phosphide core formed in a process of manufacturing indium phosphide according to some exemplary embodiments. That is, FIG. 2 shows an indium phosphide core formed in a stage for heating a mixed solution to a second temperature and injecting a phosphine precursor. As shown in FIG. 2, the indium phosphide core is formed inside the micelle.

The second temperature when the phosphine precursor is injected into the mixed solution may be different according to types of the nanostructure to be manufactured. This is because a density and a size of the formed indium phosphide core becomes different according to the second temperature. For example, when the second temperature is about 100° C. to about 140° C., a nanorod may be formed. In some exemplary embodiments, the second temperature for forming the nanorod may be about 120° C. Further, when the second temperature is about 280° C. to about 320° C., a nanowire may be formed. In some exemplary embodiments, the second temperature for forming the nanowire may be about 300° C. To form a nanowire bundle formed by combined nanowires, the second temperature may be about 180° C. to about 220° C. For example, the second temperature for forming the nanowire bundle may be about 200° C. In this manner, the manufactured nanostructure may be a nanorod, a nanowire, or a nanowire bundle according to control of the second temperature.

The mixed solution into which the phosphine precursor is injected is heated to a third temperature. The present stage represents a stage for growing the indium phosphide nanocore formed in the previous stage to form a nanostructure. The formed nanostructure may be a nanorod, a nanowire, or a nanowire bundle according to the third temperature.

Figure 3:
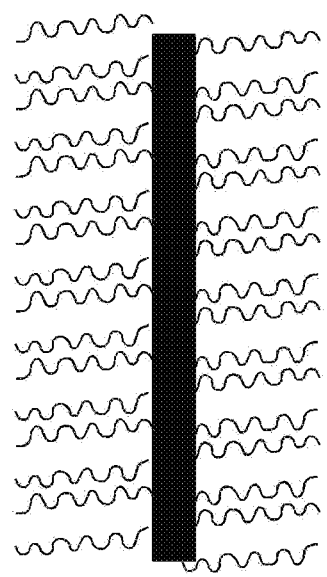
FIG. 3 shows a nanostructure formed in association with the growth of an indium phosphide core according to some exemplary embodiments.

In the present stage, the indium phosphide core grows with the indium-octadecylphosphonic acid complex compound as a template. That is, the indium phosphide core formed inside the micelle structure in the previous stage grows to be combined with an adjacent core, and, thereby, form a nanostructure. FIG. 3 shows a nanostructure formed in association with the growth of an indium phosphide core according to some exemplary embodiments. That is, FIG. 3 shows a nanostructure formed when an indium phosphide core grows.

The nanostructure is formed in a different manner depending on a third temperature and time of the present stage. That is, for example, when the third temperature is about 280° C. to about 320° C. and the temperature is maintained for about 50 minutes to about 70 minutes, an indium phosphide nanorod may be formed. In some exemplary embodiments, when the temperature is maintained at about 300° C. for about an hour, an indium phosphide nanorod may be formed.

When the third temperature is maintained at about 280° C. to about 320° C. for about 20 minutes to about 40 minutes, an indium phosphide nanowire may be formed. In some exemplary embodiments, when the third temperature is maintained at about 300° C. for about 30 minutes, an indium phosphide nanowire may be formed.

In addition, when the third temperature is maintained at about 180° C. to about 320° C. for about 10 seconds to about 7 minutes, an indium phosphide nanowire bundle may be formed. For example, when the mixed solution into which the phosphine precursor is injected is maintained at about 200° C. for about 5 minutes, an indium phosphide nanowire bundle may be formed.

However, to respectively form the nanorod, the nanowire, or the nanowire bundle in the present stage, the third temperature must satisfy the aforementioned ranges, and the second temperature in the previous stage must also be within the designated temperature ranges in which the nanorod, the nanowire, or the nanowire bundle may be formed. That is, to form the nanorod, the second temperature in the previous stage must be about 100° C. to about 140° C., and the third temperature in the present stage must be about 280° C. to about 320° C. To form the nanowire, the second temperature in the previous stage must be about 280° C. to about 320° C., and the third temperature must be about 280° C. to about 320° C. To form the nanowire bundle, the second temperature must be about 180° C. to about 220° C., and the third temperature must be about 180° C. to about 320° C.

The manufactured indium nanostructure may be used with the template combined thereto without removing the template. That is, a phosphonic acid combined to the indium phosphide nanorod, the indium phosphide nanowire, or the indium phosphide nanowire bundle may function as a ligand for spreading the nanorod in an organic solvent.

As described, the method of manufacturing an indium phosphide nanostructure according to some exemplary embodiments may simply manufacture an indium phosphide nanostructure according to a solution process by using an indium-octadecylphosphonic acid complex compound micelle as a template. A conventional method for forming non-heavy-metal nanoparticles uses the vapor-liquid-solid (VLS) scheme, which is a method for introducing a metal nanoparticle catalyst, such as gold, onto a substrate, and oversaturating the vaporized precursor into the liquefied metal nanoparticle catalyst to induce formation and growth of cores. However, the VLS method represents a vaporization process requiring a relatively high temperature and a relatively high pressure, which complicates a manufacturing process, is a relatively slow process, and is a relatively expensive process.

In addition, the solution-liquid-solid (SLS) scheme for forming non-heavy-metal nanoparticles in the solution represents a method for spreading the metal nanoparticle catalyst in the solvent to liquefy the same, and oversaturating the precursor to grow it as a one-dimensional structure. However, the SLS method also requires a stage for removing the metal nanoparticle catalyst after the nanostructure is manufactured.

However, the method of manufacturing an indium phosphide nanostructure according to some exemplary embodiments forms an indium phosphide nanostructure using the indium-octadecylphosphonic acid complex compound as a template, and, thereby, does not need an additional metal catalyst, thereby simplifying the process. Further, a reaction is generated in the solution, thereby not requiring a relatively high temperature or a relatively high pressure. To this end, the nanostructure is arranged in a one-dimensional manner by the indium-octadecylphosphonic acid template, thereby acquiring a uniform nanostructure. In addition, an aspect ratio and a size of the nanostructure may be controlled by controlling a reaction temperature, and an additional process for removing the template is not needed.

Some exemplary embodiments will now be described in detail with reference to some experimental examples.

Experimental Example 1-1: Formation of Indium Phosphide Nanorod

Indium acetate (In(OAc)$_3$) at 0.15 mL, octadecylphosphonic acid (ODPA) precursor at 0.6 mmol, and 1-octadecene solvent at 12 mL were input to a 3-neck flask, N$_2$ gas was injected thereto, and heat of 300° C. was applied. In this process, a complex compound of the indium-octadecylphosphonic acid was formed. The temperature at the reactor was reduced to 120° C., and the tris(trimethylsilyl)phosphine (P(SiCH$_3$)$_3$) precursor at 0.75 mmol was injected to form an indium phosphide core.

The reactor was heated to 300° C. to be maintained for an hour, and the temperature was lowered to finish the reaction. In the present stage, the indium phosphide core grew to be an indium phosphide nanorod.

Figure 4:
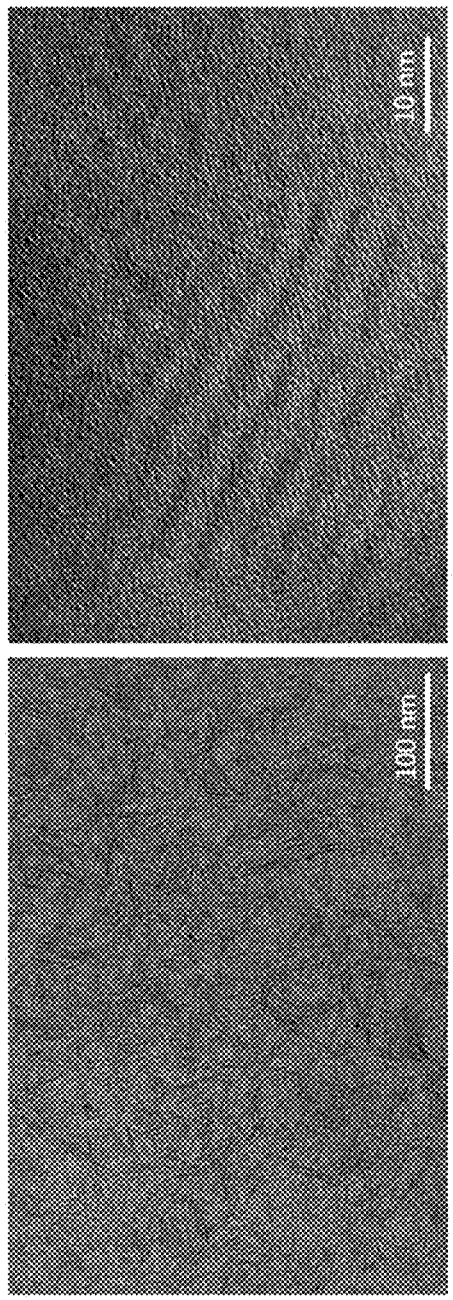
FIG. 4 shows images of an indium phosphide nanorod manufactured according to Experimental Example 1-1 according to some exemplary embodiments.
Figure 5:
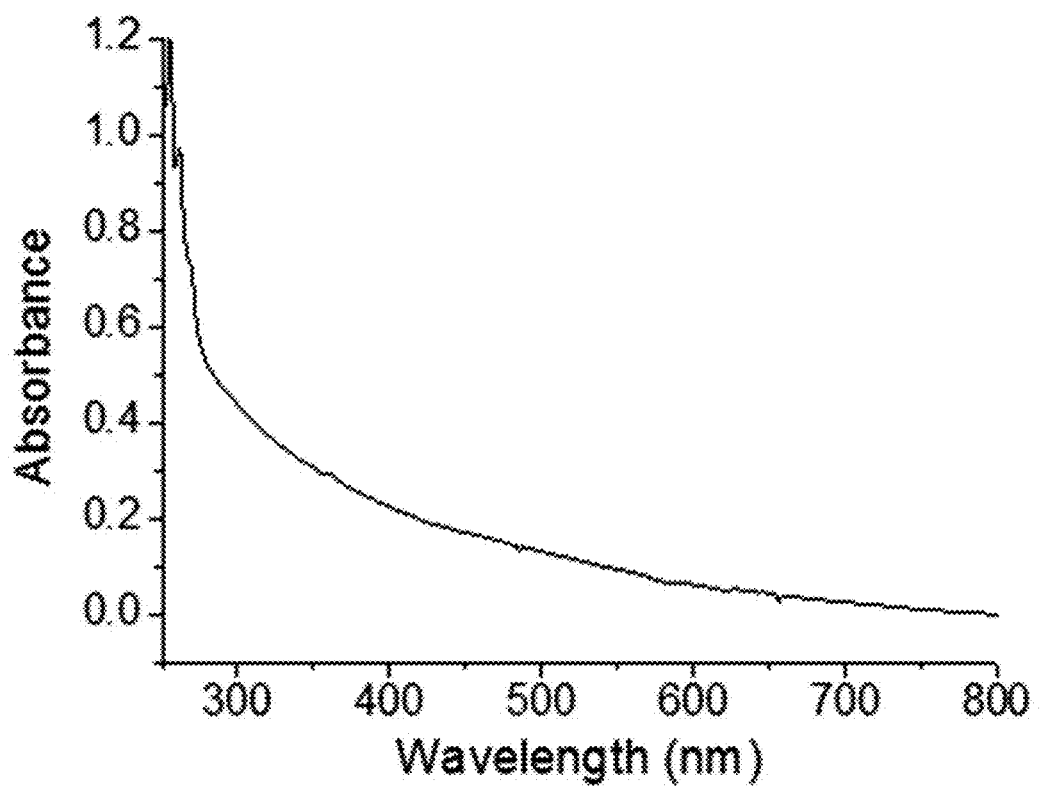
FIG. 5 shows an absorbance spectrum of an indium phosphide nanorod manufactured according to Experimental Example 1-1 according to some exemplary embodiments.

FIG. 4 shows images of an indium phosphide nanorod manufactured according to Experimental Example 1-1 according to some exemplary embodiments. FIG. 5 shows an absorbance spectrum of an indium phosphide nanorod manufactured according to Experimental Example 1-1 according to some exemplary embodiments. The depicted absorbance spectrum of the indium phosphide nanorod manufactured according to the Experimental Example 1-1 represents measured values. It was found from these measurements that a mean short-axis length of the indium phosphide nanorods acquired from the Experimental Example 1-1 is 2.2 nm, a mean long-axis length is 40 nm, and the aspect ratio of the nanorod is about 20.

Figure 6:
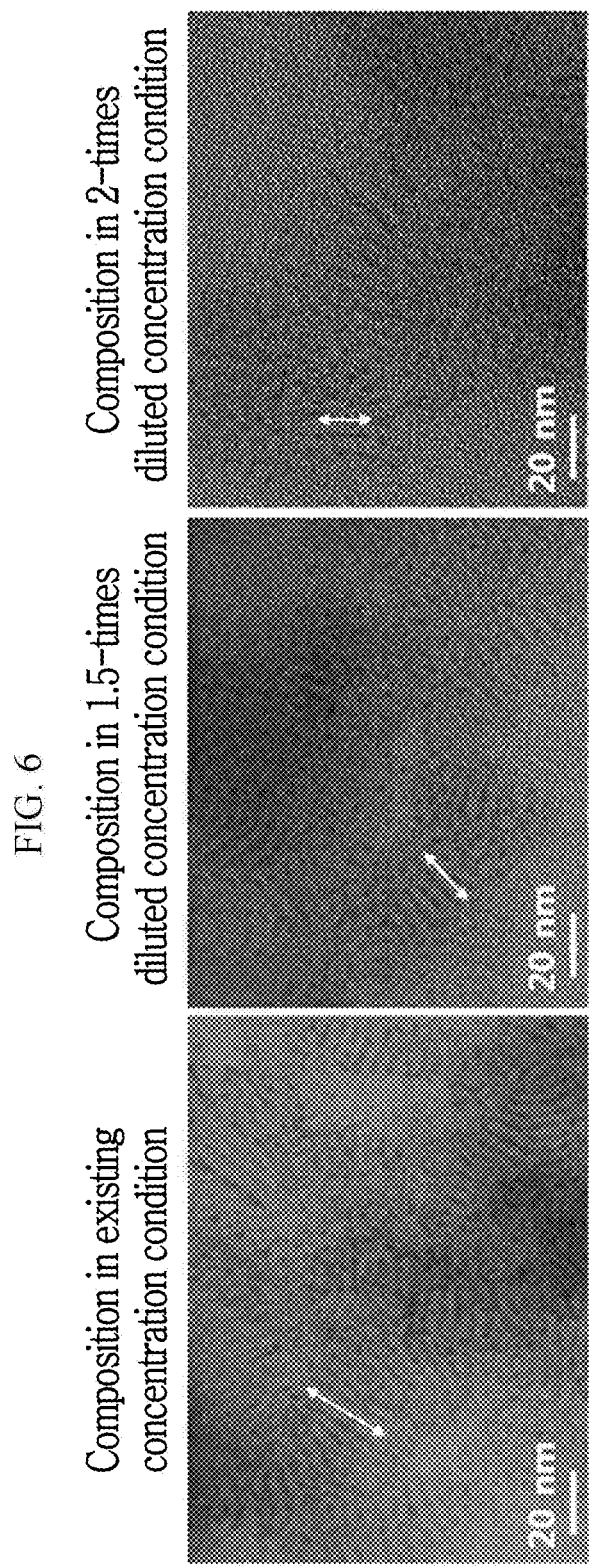
FIG. 6 shows images of indium phosphide nanorods manufactured according to Experimental Example 1-2 according to some exemplary embodiments.

Experimental Example 1-2: Control of the Aspect Ratio of the Indium Phosphide Nanorod FIG. 6 shows images of indium phosphide nanorods manufactured according to Experimental Example 1-2 according to some exemplary embodiments. Experimental Example 1-2 was performed in a manner described in association with Experimental Example 1-1, except that an amount of the used solvent was increased to dilute the precursor concentration of the solution, and the nanorods were composed, which are shown is FIG. 6 and Table 1.

TABLE 1

| Relative Concentration of Precursor | Amount of 1-Octadecene Solvent (mL) used for Composition | Short-axis Length (nm) | Long-axis Length (nm) | Aspect Ratio |
| --- | --- | --- | --- | --- |
| Existing Concentration | 12 | 2.2 | 40 | 18 |
| 1.5-times Dilution | 18 | 2.1 | 20 | 9.5 |
| 2-times Dilution | 24 | 1.5 | 17 | 11 |

Referring to Table 1 and FIG. 6, it was found that, as the amount of the 1-octadecene solvent increases, that is, as the relative concentration of the precursor becomes diluted, the aspect ratio reduces. That is, a shorter nanorod was formed. Therefore, it was found through the Experimental Example 1-2 that the manufacturing method according to some exemplary embodiments may control the aspect ratio of the nanorod by controlling the amount of the solvent.

Experimental Example 2: Formation of the Indium Phosphide Nanorod

Indium acetate (In(OAc)$_3$) at 0.15 mL, the octadecylphosphonic acid (ODPA) precursor at 0.6 mmol, and 1-octadecene solvent at 12 mL were input to a 3-neck flask, N$_2$ gas was injected thereto, and heat of 300° C. was applied. In this process, a complex compound of the indium-octadecylphosphonic acid was formed. The reactor was maintained at 300° C., and the tris(trimethylsilyl)phosphine (P(SiCH$_3$)$_3$) precursor at 0.75 mmol was injected to form an indium phosphide core. The reactor was maintained at 300° C. for 30 minutes, and the reaction was finished. In the present stage, the indium phosphide core grews to be an indium phosphide nanowire.

Figure 7:
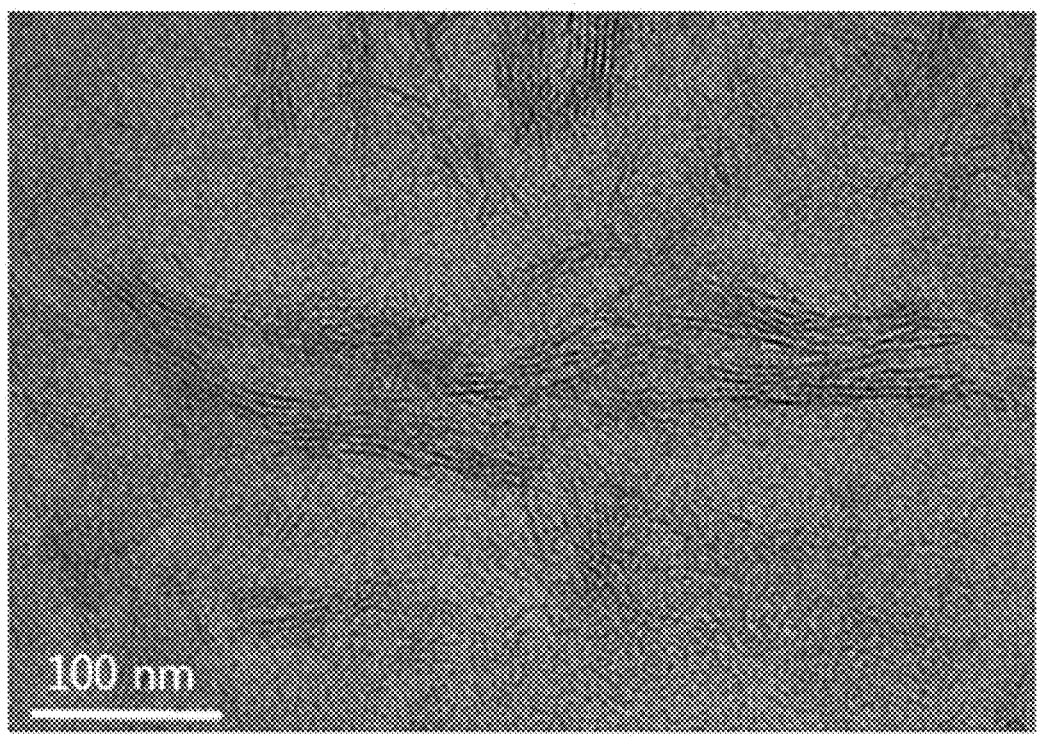
FIG. 7 shows an image of an indium phosphide nanowire manufactured according to Experimental Example 2 according to some exemplary embodiments.
Figure 8:
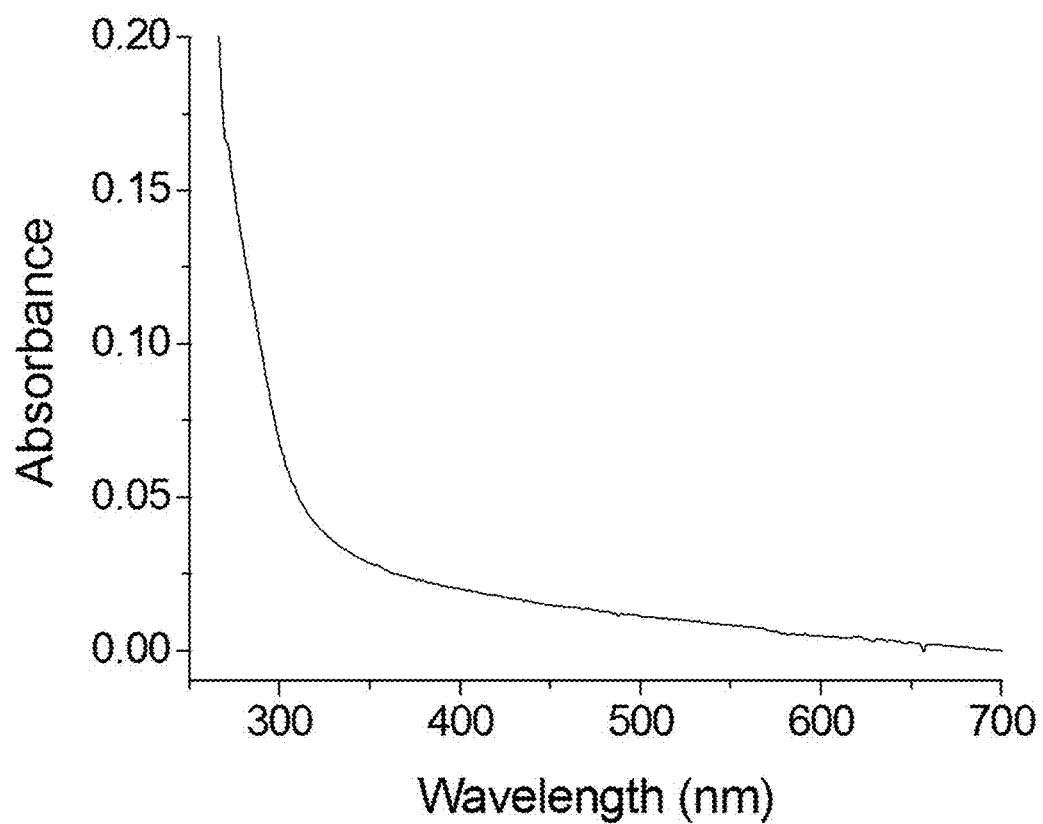
FIG. 8 shows an absorbance spectrum of an indium phosphide nanowire manufactured according to Experimental Example 2 according to some exemplary embodiments.

FIG. 7 shows an image of an indium phosphide nanowire manufactured according to Experimental Example 2 according to some exemplary embodiments. FIG. 8 shows an absorbance spectrum of an indium phosphide nanowire manufactured according to Experimental Example 2 according to some exemplary embodiments. The depicted absorbance spectrum of the indium phosphide nanowire manufactured according to the Experimental Example 2 represents measured values. It was found from the measurements that a mean diameter of the indium phosphide nanowire was 2.8 nm, a mean long axis was 200 nm, and the aspect ratio was about 70.

Experimental Example 3-1: Composition of the Indium Phosphide Nanowire Bundle

Indium acetate (In(OAc)$_3$) at 0.15 mL, octadecylphosphonic acid (ODPA) precursor at 0.6 mmol, and 1-octadecene solvent at 12 mL were input to a 3-neck flask, N$_2$ gas was injected thereto, and heat of 300° C. was applied. In this process, a complex compound of the indium-octadecylphosphonic acid was formed. The temperature of the reactor was reduced to 200° C., and the tris(trimethylsilyl)phosphine (P(SiCH3)3) precursor at 0.75 mmol was injected to form an indium phosphide core. The reactor was maintained at 200° C. to perform a reaction for five minutes, and the temperature was lowered to finish the reaction. In the present stage, the indium phosphide core grew to be a nanowire bundle structure.

Figure 9:
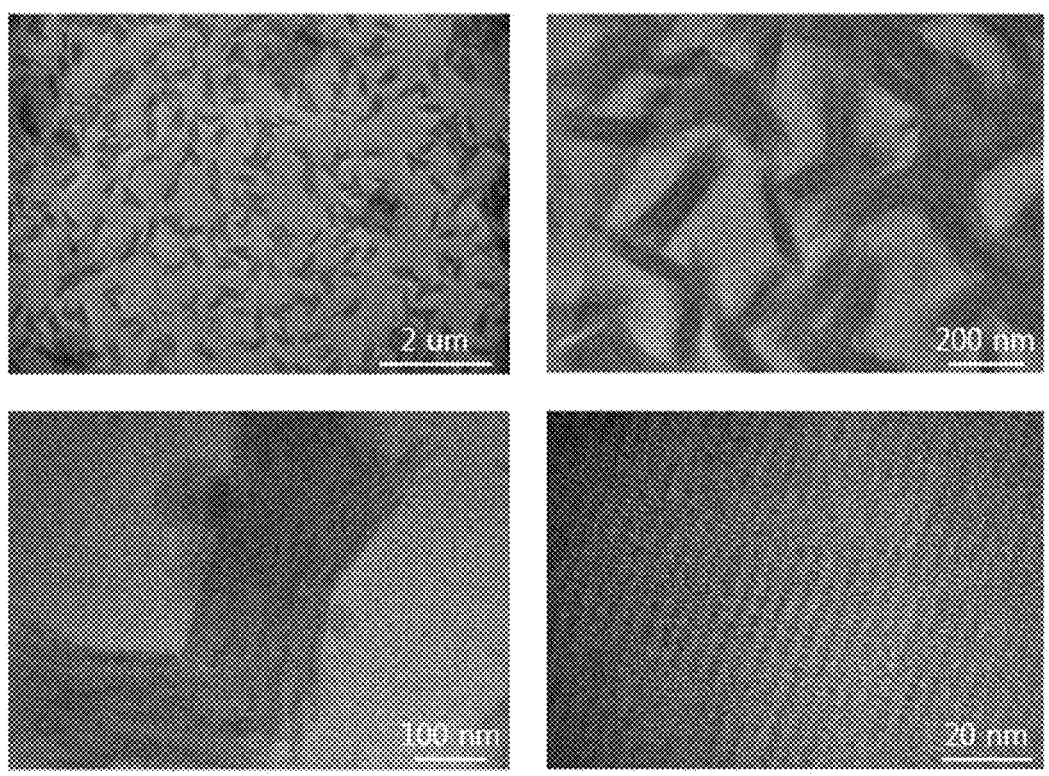
FIG. 9 shows images of an indium phosphide nanowire bundle manufactured according to Experimental Example 3-1 according to some exemplary embodiments.
Figure 10:
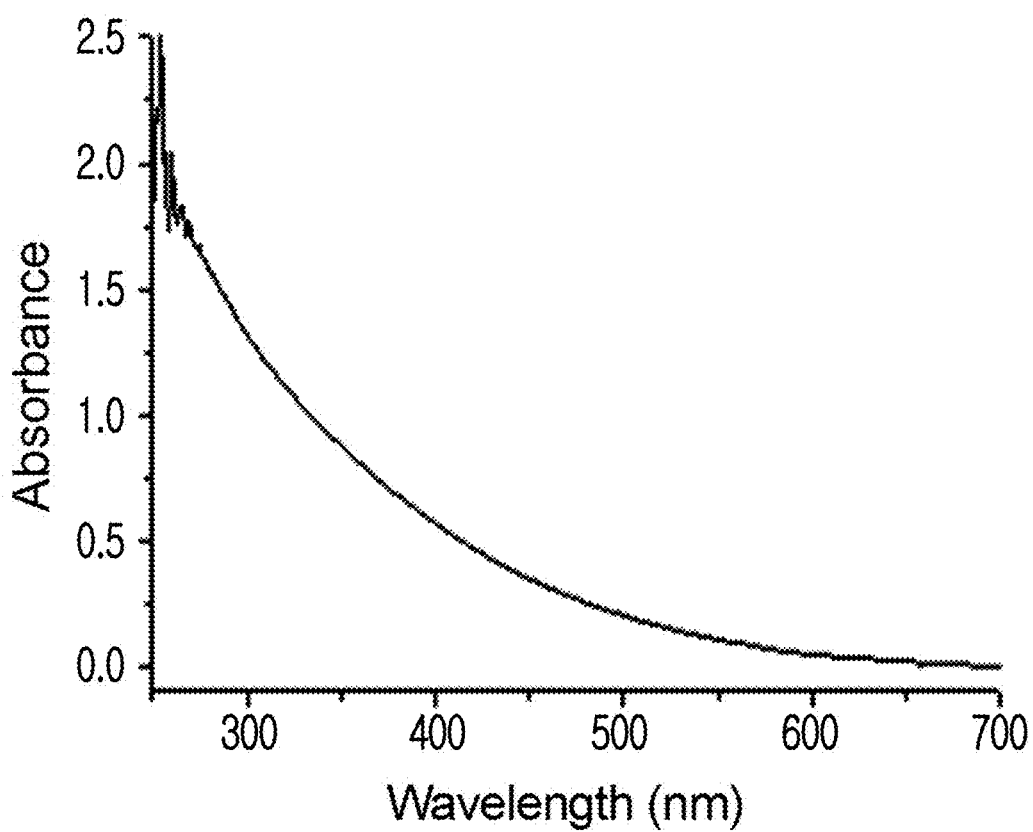
FIG. 10 shows an absorbance spectrum of an indium phosphide nanowire bundle manufactured according to Experimental Example 3-1 according to some exemplary embodiments.

FIG. 9 shows images of an indium phosphide nanowire bundle manufactured according to Experimental Example 3-1 according to some exemplary embodiments. FIG. 10 shows an absorbance spectrum of an indium phosphide nanowire bundle manufactured according to Experimental Example 3-1 according to some exemplary embodiments.

The depicted absorbance spectrum of the indium phosphide nanowire bundle manufactured according to the Experimental Example 3-1 represents measured values. It was found from the measurements that a mean short-axis length of the individual indium phosphide nanowire configuring the indium phosphide nanowire bundle manufactured according to the Experimental Example 3-1 was 2.48 nm, a mean long-axis length was 376 nm, and the aspect ratio of the nanowire was about 150. Further, it was is found that the nanowire bundle manufactured in the Experimental Example 3-1 had a width of 71.9 nm to about 200 nm by combining several tens of nanowires with the mean long-axis length of 376 nm. It was found that the sizes of the nanowires are relatively uniform, and the width of the nanowire bundle was not uniform compared to those of the nanowires.

Experimental Example 3-2: Control of the Size of the Iridium Phosphide Nanowire Bundle Experimental Example 3-2 is performed in a manner like Experimental Example 3-1, except that an amount of the used solvent was increased to dilute the precursor concentration of the solution, and the reaction temperature was increased to compose a nanowire bundle. That is, the concentration of the entire precursor was diluted, the indium phosphide nanowire bundle structure was composed at the reaction temperature of 300° C. The size of the indium phosphide nanowire bundle was compared to the size of the indium phosphide nanowire bundle manufactured according to Experimental Example 3-1, and the compared results are shown in Table 2 provided below. Further, FIG. 11 shows images of indium phosphide nanowire bundles manufactured according to Experimental Example 3-2 according to some exemplary embodiments.

TABLE 2

| | Composition Condition | | | Size of Nanowire Bundle | | | |
|---|---|---|---|---|---|---|---|
| | Growth Temperature (° C.) | Growth Time (s) | Relative Precursor Concentration | Nanowire Diameter (nm) | Nanowire Length (nm) | Nanowire Aspect Ratio | Bundle Width (nm) |
| Experimental Example 3-2 | 300 | 20 | 0.75 | 2.06 | 297 | 144 | 30-70 |
| Experimental Example 3-1 | 200 | 300 | 1 | 2.48 | 376 | 152 | 70-200 |

Figure 11:
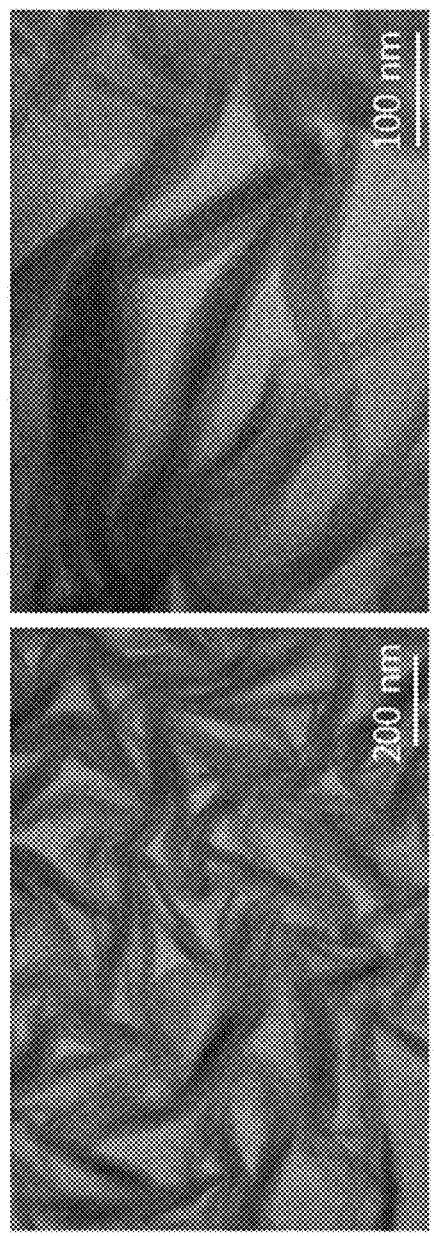
FIG. 11 shows images of indium phosphide nanowire bundles manufactured according to Experimental Example 3-2 according to some exemplary embodiments.

As can be appreciated from Table 2 and FIG. 11, the indium phosphide nanowire bundle acquired from the conditions of Experimental Example 3-2 had a width of 32.8 nm to 71.9 nm. As such, the indium phosphide nanowire bundle of Experimental Example 3-2 was narrower than the nanowire bundle (from 71.9 nm to 200 nm width) composed according to the conditions of Experimental Example 3-1.

In Experimental Example 3-2, the indium phosphide nanowire configuring the bundle had a mean short-axis length of 2.06 nm and a mean long-axis length of 297 nm. In a like manner, the indium phosphide nanowire had a shorter short-axis and long-axis compared to the indium phosphide nanowire of Experimental Example 3-1 composed at the temperature of 200° C. That is, it was found that a small number of thin and short nanowires were gathered together to form a bundle in the further-diluted concentration and high-temperature condition.

An indium phosphide nanowire bundle according to some exemplary embodiments will now be described.

The indium phosphide nanowire bundle includes a plurality of combined indium phosphide nanowires. In this instance, the indium phosphide nanowire bundle may include 10 to 100 combined indium phosphide nanowires. The indium phosphide nanowire bundle has a width of about 30 nm to about 200 nm. Also, an aspect ratio of the respective indium phosphide nanowires configuring the indium phosphide nanowire bundle may be about 40 to about 200.

The indium phosphide nanowire bundle includes a plurality of indium phosphide nanowires arranged in one direction and combined to each other such that when provided on a substrate or manufactured to be a substrate, the indium phosphide nanowire bundle may have a relatively high arrangement property and may generate increased (e.g., maximum) polarization.

As described, a method of manufacturing an indium phosphide nanostructure according to some exemplary embodiments may use a complex compound of indium-octadecylphosphonic acid as a template to manufacture the indium phosphide nanostructure without an additional metal catalyst in the solution, thereby simplifying the process and reducing the cost. Further, the aspect ratio of the manufactured indium phosphide nanostructure may be controlled by controlling the reaction temperature and the concentration of the solvent during the manufacturing process, and the indium phosphide nanorod, nanowire, or nanowire bundle. In addition, the indium phosphide nanowire bundle according to some exemplary embodiments may be formed by combining a plurality of indium phosphide nanowires in one direction. In this manner, the indium phosphide nanowire bundle can have a relatively high arrangement property on a substrate and a great polarization characteristic.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A method of manufacturing a nanostructure, the method comprising:
   heating a mixed solution to a first temperature, the mixed solution comprising a solvent, a compound comprising indium, and an octadecylphosphonic acid;
   heating the mixed solution to a second temperature;
   injecting, after heating the mixed solution to the second temperature, a phosphine precursor into the mixed solution; and
   heating the mixed solution comprising the injected phosphine precursor to a third temperature.

2. The method of claim 1, wherein the compound comprising indium represents a compound comprising trivalent indium.

3. The method of claim 2, wherein the compound comprising trivalent indium is at least one of indium acetate and indium chloride.

4. The method of claim 1, wherein:
   the solvent comprises a hydrocarbon compound; and
   a boiling point of the hydrocarbon compound is greater than or equal to 250° C. and less than or equal to 350° C.

5. The method of claim 1, wherein the phosphine precursor comprises tris(trimethylsilyl)phosphine ($P(SiCH_3)_3$).

6. The method of claim 1, wherein heating the mixed solution to the second temperature and injecting the phosphine precursor causes, at least in part, a mole ratio of indium:octadecylphosphonic acid:phosphorus in the mixed solution to be 1:3-5:4-6.

7. The method of claim 1, wherein heating the mixed solution to the first temperature comprises forming an indium-octadecylphosphonic acid complex compound.

8. The method of claim 7, wherein heating the mixed solution to the second temperature and injecting the phosphine precursor comprises forming an indium phosphide core.

9. The method of claim 8, wherein heating the mixed solution comprising the injected phosphine precursor to the third temperature comprises growing the indium phosphide core with the indium-octadecylphosphonic acid complex compound as a template.

10. The method of claim 1, wherein:
the first temperature is greater than or equal to 280° C. and less than or equal to 320° C.;
the second temperature is greater than or equal to 100° C. and less than or equal to 140° C.; and
the third temperature is greater than or equal to 280° C. and less than or equal to 320° C.

11. The method of claim 10, wherein, after heating the mixed solution comprising the injected phosphine precursor to the third temperature, the third temperature is maintained for greater than or equal to 50 minutes and less than or equal to 70 minutes.

12. The method of claim 10, wherein:
the nanostructure is a nanorod; and
an aspect ratio of the nanorod is greater than or equal to 5 and less than or equal to 30.

13. The method of claim 1, wherein:
the first temperature is greater than or equal to 280° C. and less than or equal to 320° C.;
the second temperature is greater than or equal to 280° C. and less than or equal to 320° C.; and
the third temperature is greater than or equal to 280° C. and less than or equal to 320° C.

14. The method of claim 13, wherein, after heating the mixed solution comprising the injected phosphine precursor to the third temperature, the third temperature is maintained for greater than or equal to 20 minutes and less than or equal to 40 minutes.

15. The method of claim 13, wherein:
the nanostructure is a nanowire; and
an aspect ratio of the nanowire is greater than or equal to 40 and less than or equal to 200.

16. The method of claim 1, wherein:
the first temperature is greater than or equal to 280° C. and less than or equal to 320° C.;
the second temperature is greater than or equal to 180° C. and less than or equal to 220° C.; and
the third temperature is greater than or equal to 180° C. and less than or equal to 320° C.

17. The method of claim 16, wherein, after heating the mixed solution comprising the injected phosphine precursor to the third temperature, the third temperature is maintained for greater than or equal to 10 seconds and less than or equal to 7 minutes.

18. The method of claim 16, wherein:
the nanostructure is a nanowire bundle;
the nanowire bundle is a combination of at least ten nanowires; and
an aspect ratio of each nanowire of the at least ten nanowires is greater than or equal to 40 and less than or equal to 200.

19. A nanowire bundle comprising:
an indium-octadecylphosphonic acid template;
a first indium phosphide nanowire; and
a second indium phosphide nanowire combined and arranged in a one dimensional manner with the first indium phosphide nanowire via the indium-octadecylphosphonic acid template.

20. The nanowire bundle of claim 19, wherein a width of the nanowire bundle is greater than or equal to 30 nm and less than or equal to 200 nm.

* * * * *